United States Patent
Sun et al.

(10) Patent No.: US 10,362,706 B2
(45) Date of Patent: Jul. 23, 2019

(54) SERVER SYSTEMS WITH HINGE MECHANISMS

(71) Applicant: HEWLETT PACKARD ENTERPRISE DEVELOPMENT LP, Houston, TX (US)

(72) Inventors: Geoffrey Sun, Taipei (TW); Chun-han Lin, Taipei (TW); Chang Yu Chen, Taipei (TW); Ku-Hsu Nien, Taipei (TW); Tse-Jen Sung, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/491,894

(22) Filed: Apr. 19, 2017

(65) Prior Publication Data
US 2018/0310427 A1    Oct. 25, 2018

(51) Int. Cl.
H05K 5/00    (2006.01)
H05K 7/14    (2006.01)
F16C 11/04   (2006.01)
H05K 5/02    (2006.01)

(52) U.S. Cl.
CPC ............ H05K 7/1487 (2013.01); F16C 11/04 (2013.01); H05K 5/0226 (2013.01); E05Y 2900/606 (2013.01)

(58) Field of Classification Search
None
See application file for complete search history.

(56) References Cited

U.S. PATENT DOCUMENTS

| | | | | |
|---|---|---|---|---|
| 2,857,558 A * | 10/1958 | Fiske | ...................... | B65D 85/38 312/323 |
| 4,960,256 A * | 10/1990 | Chihara | ................ | G06F 1/1616 16/361 |
| 5,103,376 A * | 4/1992 | Blonder | ................ | G06F 1/1616 16/229 |
| 5,121,296 A * | 6/1992 | Hsu | ......................... | G06F 1/183 361/679.35 |
| 5,494,447 A * | 2/1996 | Zaidan | .................. | G06F 1/1618 16/361 |
| 6,082,845 A * | 7/2000 | Eizadkhah | ............... | H05K 7/16 312/223.1 |
| 6,489,949 B1* | 12/2002 | Yin | ........................ | G06F 3/0202 345/168 |
| 6,532,147 B1* | 3/2003 | Christ, Jr. | ............. | G06F 1/1615 248/917 |
| 6,535,391 B2* | 3/2003 | Larsen | .................... | G06F 1/184 312/223.1 |
| 6,585,334 B2* | 7/2003 | Cheng | .................... | G06F 1/181 312/323 |

(Continued)

*Primary Examiner* — Courtney L Smith
*Assistant Examiner* — Rashen E Morrison
(74) *Attorney, Agent, or Firm* — Hewlett Packard Enterprise Patent Department

(57) ABSTRACT

Examples herein relate to server systems with hinge mechanisms. In one example, a server system includes a first enclosure and a second enclosure, the first and second enclosure each include a front end and a back end disposed opposite to each other, the front end having an opening. The server system further includes a hinge mechanism, the hinge mechanism connecting an upper edge of the back end of the first enclosure to an upper edge of the front end of the second enclosure. The first enclosure is adapted to rotate around the hinge mechanism.

11 Claims, 5 Drawing Sheets

(56) References Cited

U.S. PATENT DOCUMENTS

| | | | |
|---|---|---|---|
| 6,856,505 B1 | 2/2005 | Venegas | |
| 7,423,870 B2 * | 9/2008 | Carlisi | H05K 7/1489 |
| | | | 280/47.26 |
| 7,599,181 B2 * | 10/2009 | Chuang | H04M 1/022 |
| | | | 361/679.02 |
| 7,855,938 B2 | 12/2010 | Hoelsaeter | |
| 8,636,328 B2 | 1/2014 | Ye | |
| 8,878,746 B2 * | 11/2014 | Lock | G09G 3/20 |
| | | | 345/1.3 |
| 8,902,572 B2 * | 12/2014 | Yu | G06F 1/1624 |
| | | | 361/679.06 |
| 9,052,874 B2 * | 6/2015 | Richardson | G06F 1/1616 |
| 9,075,577 B2 * | 7/2015 | Huang | G06F 1/1662 |
| 9,354,667 B2 * | 5/2016 | Yang | G06F 1/1681 |
| 9,491,884 B2 | 11/2016 | Chung | |
| 2007/0115627 A1 * | 5/2007 | Carlisi | G06F 1/183 |
| | | | 361/679.01 |
| 2007/0183123 A1 * | 8/2007 | Chuan | H04M 1/022 |
| | | | 361/679.02 |
| 2012/0074078 A1 | 3/2012 | Ye et al. | |
| 2013/0182396 A1 * | 7/2013 | Hu | G06F 1/1681 |
| | | | 361/729 |
| 2014/0055959 A1 * | 2/2014 | Manda | G11B 33/128 |
| | | | 361/728 |
| 2014/0063697 A1 * | 3/2014 | Zhou | H05K 7/1487 |
| | | | 361/679.01 |

* cited by examiner

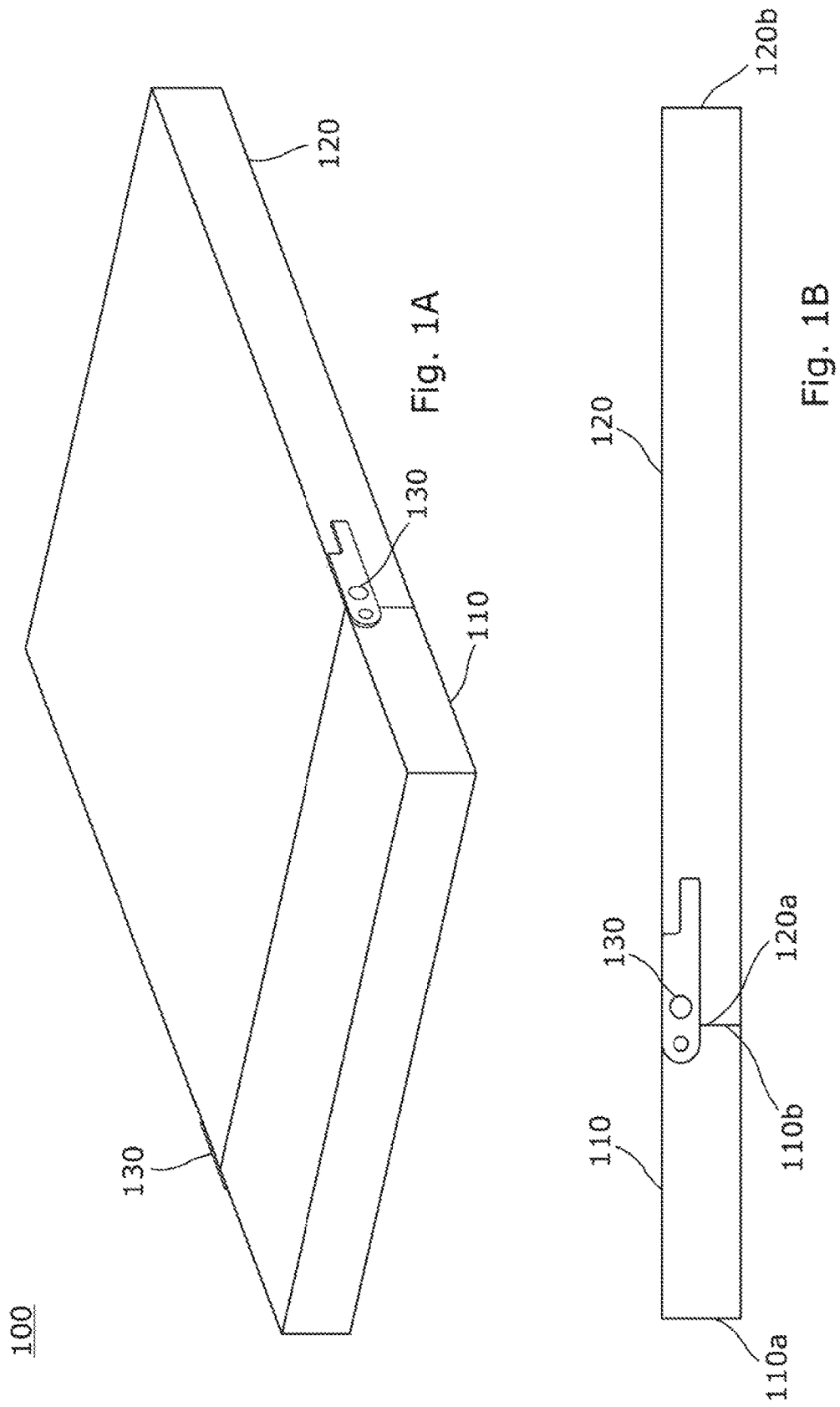

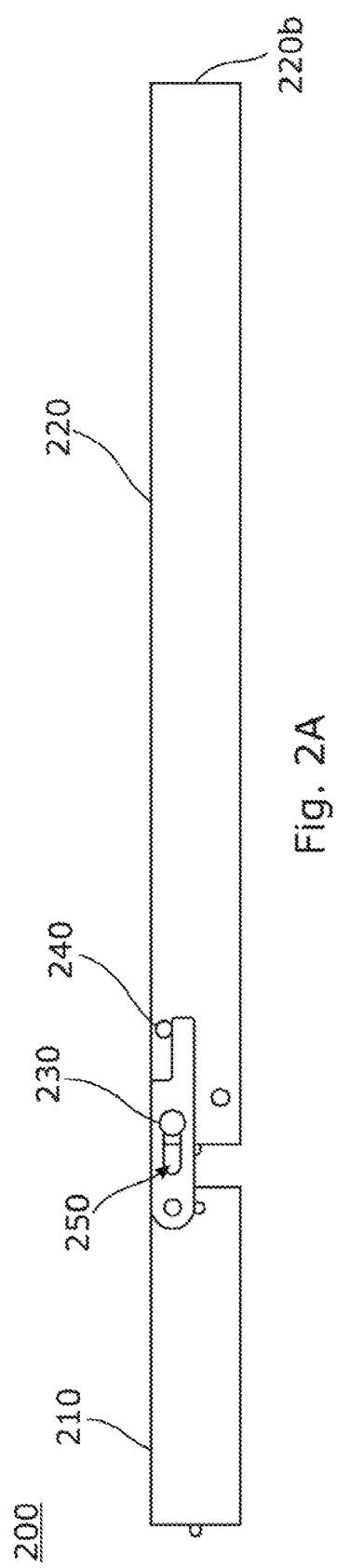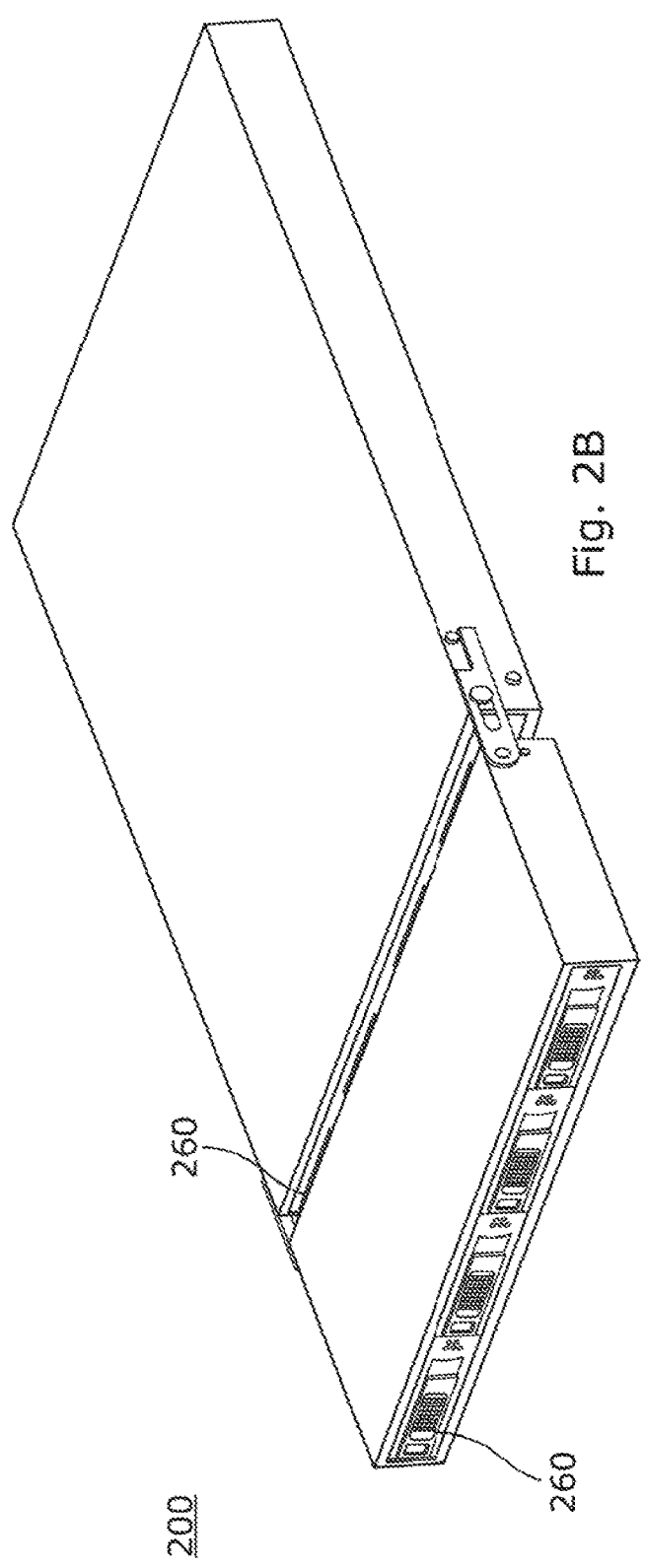

500

510
ATTACHING A FIRST LEAF OF A HINGE MECHANISM
TO A FIRST ENCLOSURE

520
ATTACHING A SECOND LEAF OF A HINGE MECHANISM
TO A SECOND ENCLOSURE

530
ROTATING THE FIRST ENCLOSURE AROUND
THE HINGE MECHANISM

Fig. 5

SERVER SYSTEMS WITH HINGE MECHANISMS

BACKGROUND

Increasing demands for storage capacity in servers prompt designers to develop new server designs that can accommodate a larger number of data storage modules supported on a single system.

BRIEF DESCRIPTION OF THE DRAWINGS

The following detailed description references the drawings, wherein:

FIGS. 1A and 1B illustrate an example of a server system according to the present disclosure.

FIGS. 2A and 2B illustrate an example of server system according to the present disclosure.

FIG. 5 illustrates an example of a flowchart for building a server system according to the present disclosure.

DETAILED DESCRIPTION

Figure 3:
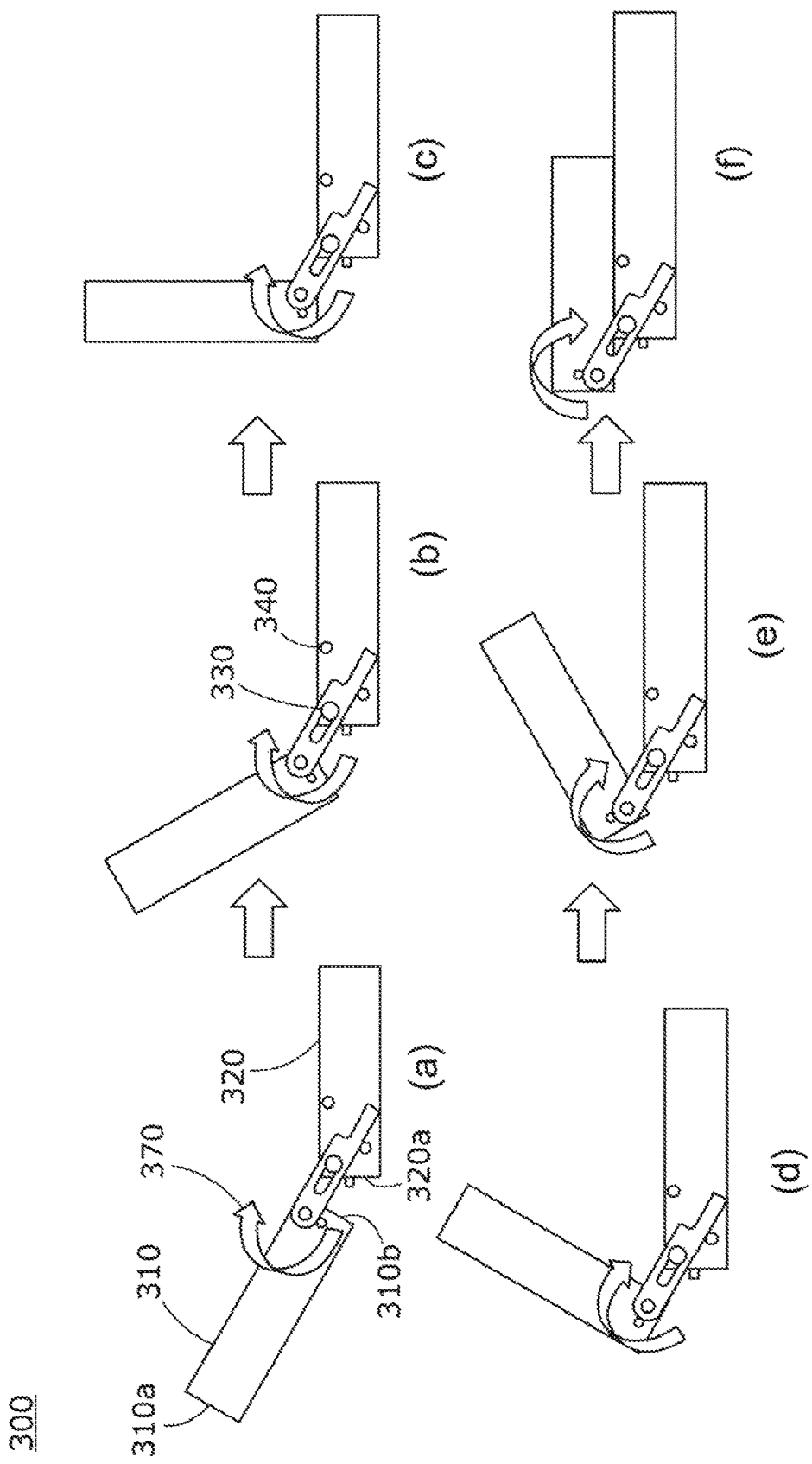
FIG. 3 illustrate several positions of an example of a server system according to the present disclosure.

The examples of server systems according to the present disclosure include a flip enclosure design having a first and a second enclosure. A hinge mechanism engaging the first and the second enclosure may permit the first enclosure to be rotated up to 180 degrees in order to provide access to the second enclosure. The hinge mechanism eliminates the use an internal rail, which in turn increases the robustness of the disclosed server system design. The hinge mechanism can support the entire weight of fully loaded enclosures when loaded onto a server rack.

FIGS. 1A and 1B show an example of a server system 100 according to the present disclosure. The server system 100 comprises a first enclosure 110 and a second enclosure 120 for storage of data storage modules such as, e.g., hard disk drives (HDD), magnetic tape drives, optical disk drives (ODDs), solid state drive (SSDs), and non-volatile memory host express (NVMe). The first and second enclosures 110 and 120, respectively each comprise a front end and a back end disposed opposite to each other as shown in FIG. 1B. In particular, the first enclosure 110 comprises a front end 110a and a back end 110b. The second enclosure 120 comprises a front end 120a and a back end 120b. The front end 110a can comprise an opening and the front end 120a can comprise an opening as well.

Furthermore, the server system 100 comprises a hinge mechanism 130. The hinge mechanism 130 can connect an upper edge of the back end 110b of the first enclosure 110 to an upper edge of the front end 120a of the second enclosure 120. The hinge mechanism 130 can permit the first enclosure 110 to rotate around the hinge mechanism 130.

FIG. 2A shows a side view of an example of a server system 200 according the present disclosure. The server system 200 can be e.g. a server system for storage of data storage modules 260. The server system 200 comprises a first enclosure 210 and a second enclosure 220. The first and second enclosures 210 and 220, respectively each comprises a front end and a back end disposed opposite to each other as it is shown in FIG. 1B. In particular, the first enclosure 210 comprises a front end 210a and a back end 210b. The second enclosure 220 comprises a front end 220a and a back end 220b. The front end 210a can comprise an opening and the front end 220a can comprise an opening as well. Data storage modules 260 can be introduced into the first enclosure 210 and the second enclosure 220 through the openings of the front end 210a and the front end 220a, respectively as it is shown in FIG. 2B.

Furthermore, hard points 240 can be established on the lateral sides of the first enclosure 210 and the lateral sides of the second enclosure 220. In this particular example, the first enclosure 210 comprises two hard points 240 (one on each side of the first enclosure 210) and the second enclosure 220 comprises four hard points 240 (two on each side of the second enclosure 220) as it is shown in FIG. 2A. The hard points can limit the rotation and/or movement of the first enclosure and the hinge mechanism permitting an efficient rotation of the first enclosure and reliable functioning of the hinge mechanism.

Furthermore, the server system 200 comprises a hinge mechanism 230. The hinge mechanism 230 can connect an upper edge of the back end 210b of the first enclosure 210 to an upper edge of the front end 220a of the second enclosure 220. The hinge mechanism 230 can permit the first enclosure 210 to rotate around the hinge mechanism 230. The hinge mechanism 230 further comprises a mechanical linkage 250 that permits the first enclosure 210 to be separated from the second enclosure 220 so that the back end 210b of the first enclosure 210 does not contact the front end 220a of the second enclosure 220 as it shown in FIG. 2B.

FIG. 3 shows several positions of an example of a server system 300 according to the present disclosure. The server system 300 comprises a first enclosure 310 and a second enclosure 320. The first enclosure 310 comprises a front end 310a and a back end 310b. The second enclosure 320 comprises a front end 320a and a back end 320b. In particular, FIG. 3 shows positions "a", "b", "c", "d", "e" and "f". These six positions of the server system 300 may permit a user or operator to access the opening established on the front end 320a of the second enclosure 320. A user can hold the first enclosure 310 and rotate the first enclosure which is engaged to the hinge mechanism 330 by starting in position "a" and continuing to reach position "f" where the top of the first enclosure 310 contacts the top of the second enclosure 320. The hinge mechanism 330 comprises a mechanical linkage that permits the first enclosure 310 to be separated from the second enclosure 320 and rotate in the direction shown by arrows 370. Furthermore, the first and the second enclosures comprise several hard points 340. The hard points can limit the rotation and/or movement of the hinge mechanism and can permit reliable functioning of the hinge mechanism 330 as it is shown in positions "a" to "f".

It should be noted that an opening established on the front end 310a of the first enclosure 310 can be accessed without rotating the first enclosure 310 from position "a" to "f". However, an opening established on a front end 320a of the second enclosure 320 may be blocked by the first enclosure 310. Hence, the aforementioned positions "a" to "f" can be performed in order to access the front end 320a of the second enclosure 320. Moreover, positions "a" through "f" may be performed in reverse in order to return the first enclosure 310 back to the closed position.

Figure 4:
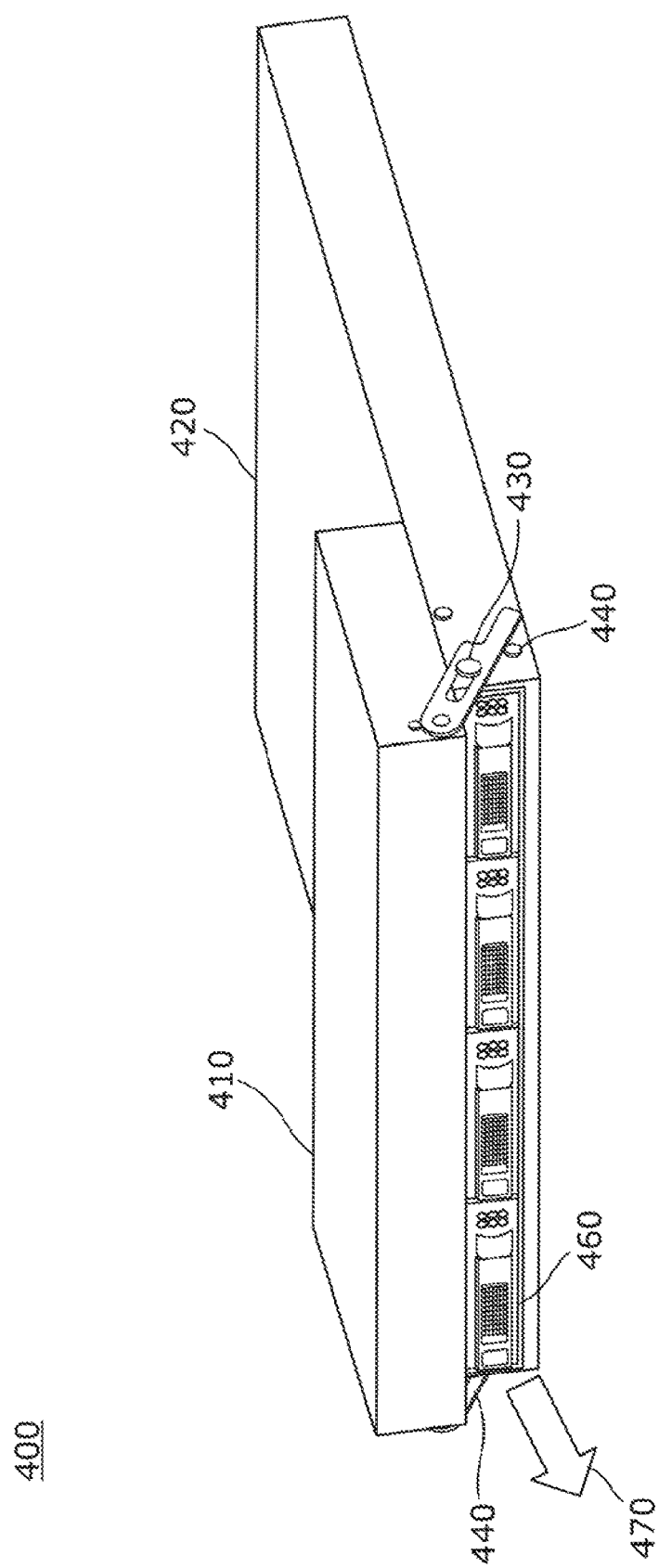
FIG. 4 illustrates an example of a server system in a specific position according to the present disclosure.

FIG. 4 shows an example of a server system 400 according to the present disclosure. The server system 400 comprises a first enclosure 410 and a second enclosure 420, a hinge mechanism 430 and several hard points 440. The first enclosure 410 and the second enclosure 420 can have a rectangular shape. The position of the server system 400 corresponds to the position "f" shown in previous FIG. 3.

FIG. 4 shows the second enclosure 420 loaded with data storage modules 460. The data storage modules 460 can be loaded into the first enclosure 410 and/or the second enclosure 420 and removed in the direction shown by arrow 470, replaced, etc.

FIG. 5 shows an example of a flowchart 500 for building a server system according to the present disclosure, such as any of the server systems illustrated in FIGS. 1-4.

In some implementations, flowchart 500 may comprise a step 510 that includes attaching a first leaf of a hinge mechanism to a first enclosure. The term first leaf can indicate a part first of the hinge mechanism that engages the first enclosure. In this regard, attaching a first leaf of a hinge mechanism to a first enclosure comprises attaching the first leaf to an upper edge of the back end of the first enclosure.

As shown in previous figures, the first and the second enclosure each comprises a front end and a back end disposed opposite to each other. The front end of the first and the second enclosure can have an opening. Furthermore, the first and the second enclosure can comprise a bottom plate and a top plate disposed opposite to each other. In some examples, the first enclosure and the second enclosure have a parallelepiped shape.

In some implementations, flowchart 500 may comprise a step 520 that includes attaching a second leaf of the hinge mechanism to a second enclosure. The term second leaf can indicate a second part of the hinge mechanism that can engage the second enclosure. In this regard, attaching a second leaf of a hinge mechanism to a second enclosure comprises attaching the second leaf of the hinge mechanism to an upper edge of the front end of the second enclosure.

Any type of hinge mechanism could be used as e.g. butt hinge, knife hinge or a hinge with a mechanical linkage as shown in examples of FIGS. 2 to 4.

In some implementations, flowchart 500 may comprise a step 530 that includes rotating the first enclosure around the hinge mechanism. This rotation can be seen in FIG. 4 where the server system moves from a closed position "a" to an opened position "f", where the top plate of the first enclosure contacts the top plate of the second enclosure in the opened position. This rotation may permit a user or an operator to access the opening of the second enclosure in order to load the second enclosure with data storage modules.

In some implementations, flowchart 500 may comprise steps including loading the first enclosure with one or more data storage modules, removing data storage modules from the first enclosure, and/or replacing data storage modules in the first enclosure.

In some implementations, flowchart 500 may comprise a step that includes accessing the front end of the second enclosure after rotating the first enclosure around the hinge mechanism according to step 530. Accessing the front end of the second enclosure after rotation the first enclosure around the hinge can permit to perform steps for loading the second enclosure with data storage modules, removing data storage modules from the second enclosure, and/or replacing data storage modules in the second enclosure.

Relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the present disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A server system, comprising:
a first enclosure and a second enclosure; and
a hinge mechanism, the hinge mechanism connecting an upper edge of a back end of the first enclosure to an upper edge of a front end of the second enclosure such that the first enclosure can move between a first configuration and a second configuration, wherein in the first configuration the first enclosure is located in front of the second enclosure and a back end of the first enclosure is adjacent a front end of the second enclosure, and in the second configuration the first enclosure is located on top of the second enclosure,
wherein the hinge mechanism is configured to allow the first enclosure to rotate 180 degrees relative to the second enclosure.

2. The server system of claim 1, wherein the first enclosure is adapted to store data storage modules.

3. The server system of claim 2, wherein the second enclosure is adapted to store data storage modules.

4. The server system of claim 1, wherein the first enclosure is rotatable around a first axis fixed relative to the hinge mechanism and the hinge mechanism is rotatable around a second axis fixed relative to the second enclosure.

5. The server system of claim 1, further comprising:
one or more points on outer sides of the second enclosure that engage with the hinge mechanism to limit rotation of the hinge mechanism relative to the second enclosure.

6. The server system of claim 1, further comprising: one or more points on outer sides of the first enclosure that engage with the hinge mechanism to limit rotation of the first enclosure relative to the hinge mechanism.

7. The server system of claim 1, wherein, in the first configuration, the back end of the first enclosure is in contact with the front end of the second enclosure.

8. The server system of claim 7, wherein the hinge mechanism comprises a mechanical linkage that allows the first enclosure, starting in the first configuration, to be moved laterally away from the second enclosure prior to rotating towards the second configuration.

9. The server system of claim 1,
wherein a top plate of the first enclosure contacts a top plate of the second enclosure when the first enclosure is in the second configuration.

10. A server system, comprising:
a first enclosure and a second enclosure; and
a hinge mechanism, the hinge mechanism connecting an upper edge of a back end of the first enclosure to an upper edge of a front end of the second enclosure such that the first enclosure can move between a first configuration and a second configuration, wherein in the first configuration the first enclosure is located in front of the second enclosure and a back end of the first enclosure is adjacent a front end of the second enclosure, and in the second configuration the first enclosure is located on top of the second enclosure,
wherein the hinge mechanism is configured to allow the first enclosure to rotate relative to the second enclosure, and the first enclosure is rotatable around a first axis fixed relative to the hinge mechanism and the hinge mechanism is rotatable around a second axis fixed relative to the second enclosure.

11. A server system, comprising:

a first enclosure and a second enclosure; and a hinge mechanism, the hinge mechanism connecting an upper edge of a back end of the first enclosure to an upper edge of a front end of the second enclosure such that the first enclosure can move between a first configuration and a second configuration, wherein in the first configuration the first enclosure is located in front of the second enclosure and a back end of the first enclosure is in contact with a front end of the second enclosure, in the second configuration the first enclosure is located on top of the second enclosure, and the hinge mechanism is configured to allow the first enclosure to rotate relative to the second enclosure and comprises a mechanical linkage that allows the first enclosure, starting in the first configuration, to be moved laterally away from the second enclosure prior to rotating towards the second configuration.

\* \* \* \* \*